(12) United States Patent
Minamio et al.

(10) Patent No.: US 6,642,609 B1
(45) Date of Patent: Nov. 4, 2003

(54) LEADFRAME FOR A SEMICONDUCTOR DEVICE HAVING LEADS WITH LAND ELECTRODES

(75) Inventors: Masanori Minamio, Osaka (JP); Osamu Adachi, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/654,070

(22) Filed: Sep. 1, 2000

(30) Foreign Application Priority Data

Sep. 1, 1999 (JP) ............................. 11-247530

(51) Int. Cl.[7] ................. H01L 23/50; H01L 23/48; H01L 23/28; H01L 23/495
(52) U.S. Cl. .................. 257/666; 257/684; 257/796; 257/672; 257/671; 257/670; 257/676; 257/698; 257/696
(58) Field of Search ................ 257/666, 684, 257/796, 672, 671, 670, 676, 692, 693, 696, 698, 787, 788

(56) References Cited

U.S. PATENT DOCUMENTS

| | | | | |
|---|---|---|---|---|
| 5,089,878 A | * | 2/1992 | Lee | |
| 5,977,630 A | * | 11/1999 | Woodworth et al. | ........ 257/712 |
| 6,028,350 A | * | 2/2000 | Sabyeying | ................... 257/670 |
| 6,047,467 A | * | 4/2000 | Hamzehdoost et al. | ..... 257/690 |
| 6,081,029 A | * | 6/2000 | Yamaguchi et al. | ........ 257/718 |
| 6,130,115 A | * | 10/2000 | Okumura et al. | ............. 257/676 |
| 6,191,494 B1 | * | 2/2001 | Ooyanma et al. | ............ 257/796 |
| 6,201,294 B1 | * | 3/2001 | Lee | ............................. 257/669 |
| 6,204,554 B1 | * | 3/2001 | Ewer et al. | .................. 257/705 |
| 6,208,020 B1 | * | 3/2001 | Minamio et al. | ............ 257/684 |
| 6,208,023 B1 | * | 3/2001 | Nakayama et al. | ......... 257/696 |
| 6,281,568 B1 | * | 8/2001 | Glenn et al. | ................. 257/684 |
| 6,319,753 B1 | * | 11/2001 | Ichikawa et al. | ............ 257/675 |
| 2001/0045629 A1 | * | 11/2001 | Corisis | ........................ 257/666 |
| 2002/0105060 A1 | * | 8/2002 | Misumi et al. | .............. 257/666 |

FOREIGN PATENT DOCUMENTS

JP             0195634         * 7/1999

* cited by examiner

*Primary Examiner*—Alexander O. Williams
(74) *Attorney, Agent, or Firm*—Nixon Peabody LLP; Donald R. Studebaker

(57) ABSTRACT

In a leadframe for an LGA package, a lead member is pressed downward to form a land lead with a half-cut portion and a land portion. The land portion, whose bottom will be a land electrode, is inclined at a predetermined angle and the bottom of the land portion is made lower than that of a lead. Thus, in a resin molding process using a seal sheet, the land electrode is forced into, and strongly adhered to, the seal sheet when pressure is applied through dies, and no resin encapsulant reaches the land electrode. As a result, no resin bur will be left on the land electrode of the land lead.

8 Claims, 13 Drawing Sheets

LEADFRAME FOR A SEMICONDUCTOR DEVICE HAVING LEADS WITH LAND ELECTRODES

BACKGROUND OF THE INVENTION

The present invention relates to a leadframe, which includes leads with land electrodes functioning as external terminals and can replace a conventional leadframe with beam-like leads. The present invention also relates to a method for manufacturing a land-grid-array (LGA) resin-molded semiconductor device, in which a semiconductor chip is bonded onto the leadframe and the assembly is molded with a resin encapsulant.

In recent years, to catch up with rapidly advancing downsizing of electronic units, it has become increasingly necessary to assemble semiconductor components, like resin-molded semiconductor devices, at a higher and higher density. In response, sizes and thicknesses of semiconductor components have also been noticeably reduced. In parallel with this downsizing trend, the number of pins needed for a single electronic unit is also increasing day after day. To meet these demands, resin-molded semiconductor devices of a greatly shrunken size and with a drastically reduced thickness should now be assembled at an even higher density.

Hereinafter, a conventional leadframe for a resin-molded semiconductor device will be described.

FIG. 22 is a plan view illustrating the structure of a conventional leadframe. As illustrated in FIG. 22, the leadframe includes rectangular die pad 102, support leads 103, beam-like inner leads 104, outer leads 105 and tie bars 106, all of these members being provided inside a frame rail 101. The die pad 102 is used for mounting a semiconductor chip thereon. The support leads 103 support the die pad 102. The inner leads 104 will be electrically connected to the semiconductor chip with some connection members like metal fine wires. The outer leads 105 are joined to the respective inner leads 104 and to be connected to external terminals. And the tie bars 106 are provided for joining and fixing the outer leads 105 together and for preventing a resin encapsulant from overflowing during a resin molding process.

It should be noted that normally the leadframe does not consist of the single pattern shown in FIG. 22, but is made up of a plurality of such patterns, which are arranged and connected together both horizontally and vertically.

Next, a known resin-molded semiconductor device will be described. FIG. 23 is a cross-sectional view illustrating a resin-molded semiconductor device including the leadframe shown in FIG. 22.

As shown in FIG. 23, a semiconductor chip 107 has been bonded onto the die pad 102 of the leadframe and electrically connected to the inner leads 104 with metal fine wires 108. The semiconductor chip 107 on the die pad 102, the inner leads 104 and so on have been molded with a resin encapsulant 109. The outer leads 105 protrude from the side faces of the resin encapsulant 109 and have had their outer ends bent downward.

Next, a method for manufacturing the resin-molded semiconductor device will be described with reference to FIGS. 23 and 24. First, the semiconductor chip 107 is bonded, with an adhesive, onto the die pad 102 of the leadframe. This process step is called "die bonding". Next, the semiconductor chip 107 is connected to the respective inner ends of the inner leads 104 with the metal fine wires 108. This process step is called "wire bonding". Subsequently, the semiconductor chip 107 and a portion of the leadframe inside the tie bars 106 (i.e., the inner leads 104 and so on) are molded with the resin encapsulant 109 such that the outer leads 105 protrude outward. This process step is called "resin molding". Finally, the tie bars 106 are cut off at the boundary between the tie bars 106 and the resin encapsulant 109 to separate the outer leads 105 from each other and remove the frame rail 101, and the respective outer ends of the outer leads 105 are bent. This process step is called "tie bar cutting and bending". In this manner, a resin-molded semiconductor device with the structure shown in FIG. 23 is completed. In FIG. 24, the dashed line indicates a region where the assembly is molded with the resin encapsulant 109.

As described above, the number of devices that should be integrated within a single semiconductor chip, or the number of pins per chip, has been on the rise these days. Thus, the number of outer leads should also be increased to catch up with this latest trend. That is to say, the number of inner leads, which are joined to the outer leads, should preferably be increased to cope with such an implementation. However, the width of the inner (or outer) lead has a processable limit. Thus, as the number of inner (or outer) leads is increased, the overall size of the leadframe and that of the resulting resin-molded semiconductor device also increase. In view of these states in the art, it is difficult to realize a downsized and thinned resin-molded semiconductor device. On the other hand, if only the number of inner leads is increased to cope with the rise in the number of pins needed for a semiconductor chip while using a leadframe of substantially the same size, then the width of a single inner lead should be further reduced. In such a case, however, it is much more difficult to perform various process steps for forming the leadframe, like etching, as originally designed.

Recently, face-bonded semiconductor devices, such as ball grid array (BGA) types and land grid array (LGA) types, are also available. In the semiconductor device of any of these types, first, a semiconductor chip is mounted onto a carrier (e.g., a printed wiring board) including external electrodes (e.g., ball electrodes or land electrodes) on its bottom. Next, the semiconductor chip is electrically connected to the external electrodes. And then the chip and its associated members are molded with a resin encapsulant on the upper surface of the carrier. The semiconductor device of this face-bonded type, which is mounted directly on a motherboard on the bottom, will be a mainstream product in the near future. Accordingly, it is now clear that the conventional leadframe and resin-molded semiconductor device using the leadframe will soon be out of date under the circumstances such as these.

Also, the conventional resin-molded semiconductor device includes outer leads protruding outward from the side faces of a resin encapsulant, and is supposed to be mounted onto a motherboard by bonding the outer leads to the electrodes on the motherboard. Accordingly, the conventional device cannot be mounted onto the board so reliably as the semiconductor devices of the BGA and LGA types. Nevertheless, the semiconductor devices of the BGA and LGA types are expensive, because these devices use a printed wiring board.

SUMMARY OF THE INVENTION

It is therefore an object of the present invention to provide a leadframe effectively applicable to a resin-molded semiconductor device, in which external terminals are arranged and exposed in lines on the bottom of the package with almost no resin bur left on.

It is another object of the present invention to provide a method for manufacturing the resin-molded semiconductor device using the leadframe.

An inventive leadframe includes a frame rail, a die pad, support leads and first and second groups of leads. The frame rail is made of a metal plate. The die pad is used for mounting a semiconductor chip thereon, and disposed approximately in a center region of an opening of the frame rail. One end of each of the support leads supports the die pad, while the other end thereof is connected to the frame rail. One end of each of the leads of the first group extends toward the die pad at least partially, while the other end thereof is connected to the frame rail. The bottom of each lead of the first group is used as a land electrode of a first group. One end of each of the leads of the second group extends toward the die pad and is closer to the die pad than the end of the lead of the first group is, while the other end thereof is connected to the frame rail. Part of the bottom of each lead of the second group is used as a land electrode of a second group. The first and second groups of land electrodes are arranged in two lines. At least part of each lead of the second group has been pressed down by half-cut pressworking such that the bottom of each land electrode of the second group is lower than that of each land electrode of the first group. That part of the lead of the second group is inclined downward.

If a resin-molded semiconductor device is formed using this leadframe, a land grid array (LGA) package can be obtained. That is to say, external terminals will be arranged in two lines on the bottom of this package. Specifically, the second group of land electrodes of land leads (i.e., the second group of leads) forms the inner one of the two, while the first group of land electrodes of leads (i.e., the first group of leads) forms the outer line. At least part of each lead of the second group has been pressed down by half-cut pressworking such that the bottom of each land electrode of the second group is lower than that of each land electrode of the first group. In addition, that part of the lead of the second group is inclined downward. Accordingly, when a pressure is applied to these leads, the bottom of the land electrode of the second group is forced into, and strongly adhered to, a seal sheet, and no resin encapsulant reaches the land electrode. As a result, a package, including external terminals with no resin bur left on, can be obtained.

In one embodiment of the present invention, that part of the lead of the second group is preferably inclined at an angle between 3 and 15 degrees with a principal surface of the leadframe.

An inventive method for manufacturing a resin-molded semiconductor device includes the step of a) preparing a leadframe. The leadframe includes a frame rail, a die pad, support leads and first and second groups of leads. The frame rail is made of a metal plate. The die pad is used for mounting a semiconductor chip thereon, and disposed approximately in a center region of an opening of the frame rail. One end of each of the support leads supports the die pad, while the other end thereof is connected to the frame rail. One end of each of the leads of the first group extends toward the die pad at least partially, while the other end thereof is connected to the frame rail. The bottom of each lead of the first group is used as a land electrode of a first group. One end of each of the leads of the second group extends toward the die pad and is closer to the die pad than the end of the lead of the first group is, while the other end thereof is connected to the frame rail. Part of the bottom of each lead of the second group is used as a land electrode of a second group. The first and second groups of land electrodes are arranged in two lines. At least part of each lead of the second group has been pressed down by half-cut pressworking such that the bottom of each land electrode of the second group is lower than that of each land electrode of the first group. And that part of the lead of the second group is inclined downward. The method further includes the steps of: b) bonding a semiconductor chip onto the die pad of the leadframe prepared; c) connecting electrode pads, which are formed on the principal surface of the semiconductor chip bonded to the die pad, to respective upper surfaces of the first and second groups of leads of the leadframe with metal fine wires; d) adhering a seal sheet to at least the bottoms of the die pad and the first and second groups of leads on the backside of the leadframe; e) molding an upper part of the leadframe, the semiconductor chip, the die pad and the metal fine wires together with a resin encapsulant, while applying a pressure to at least the ends of the first and second groups of leads to press the first and second groups of land electrodes against the seal sheet; and f) stripping the seal sheet from the leadframe after the step e) has been performed.

In this method, a resin-molded semiconductor device is formed by mounting a semiconductor chip on the leadframe, connecting the chip to the leads (whose bottoms will be land electrodes as external terminals) with metal fine wires and then molding these members together with a resin encapsulant. In this manner, a land grid array (LGA) package can be obtained. That is to say, external terminals will be arranged in two lines on the bottom of the resin-molded semiconductor device (or the package). Specifically, the second group of land electrodes of land leads (i.e., the second group of leads) forms the inner one of the two, while the first group of land electrodes of leads (i.e., the first group of lead) forms the outer line. Part of each lead of the second group has been pressed down by half-cut pressworking such that the bottom of the land electrode of the second group is lower than that of the land electrode of the first group. In addition, that part of the lead of the second group is inclined downward. Accordingly, when a pressure is applied to these leads, the bottoms of the land electrodes of the second group are forced into, and strongly adhered to, a seal sheet. That is to say, it is possible to prevent the leads of the second group from being lifted by the pressure applied during the injection of the resin encapsulant, and no resin encapsulant reaches the land electrodes. As a result, no resin bur will be left on the land electrodes of the second group.

DESCRIPTION OF THE PREFERRED EMBODIMENTS

Hereinafter, preferred embodiments of the present invention will be described with reference to the accompanying drawings.

Embodiment 1

A first embodiment of the present invention relates to a leadframe, a resin-molded semiconductor device including the leadframe and a method for manufacturing the device.

First, a leadframe according to the first embodiment will be described.

Figure 1:
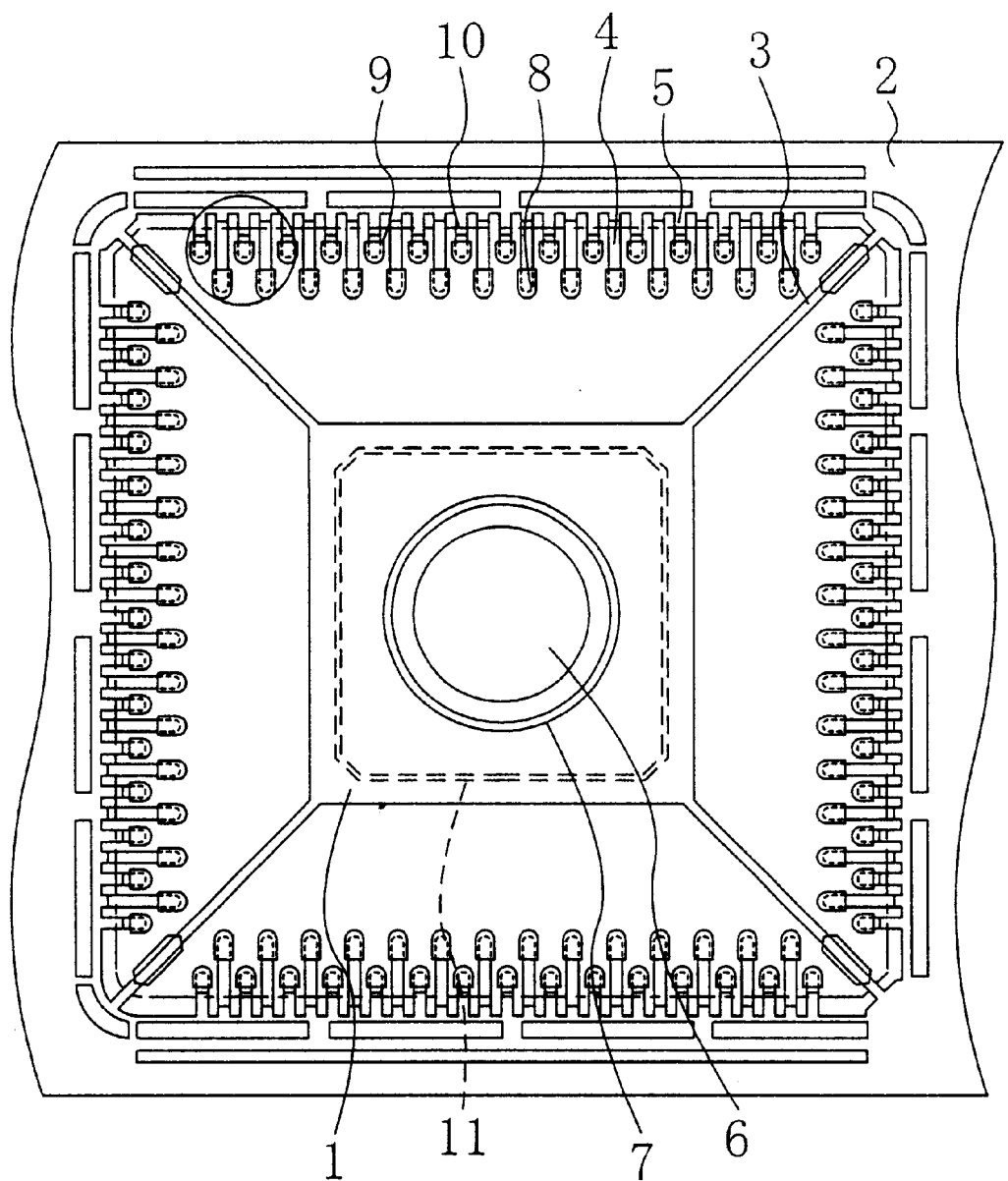
FIG. 1 is a plan view illustrating a leadframe according to the present invention.
Figure 2A:
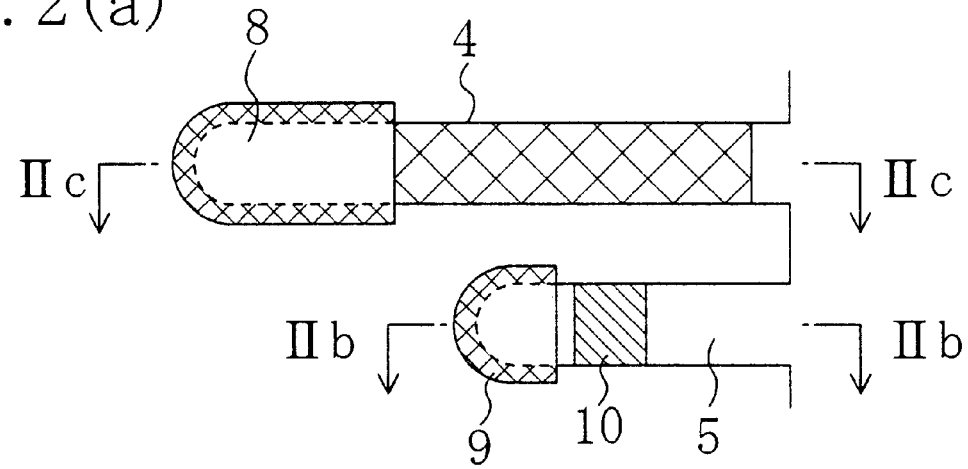
FIG. 2(a) is a plan view illustrating a land lead and a lead according to a first embodiment of the present invention.
Figure 2B:
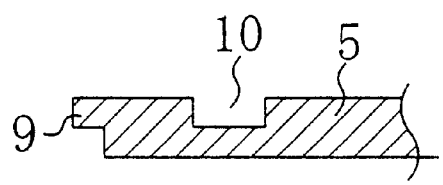
FIG. 2(b) is a cross-sectional view of the lead taken along the line IIb—IIb shown in FIG. 2(a)
Figure 2C:
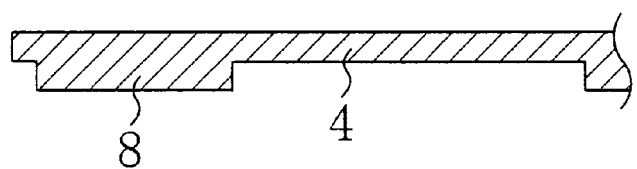
FIG. 2(c) is a cross-sectional view of the land lead taken along the line IIc—IIc shown in FIG. 2(a).

FIG. 1 is a plan view illustrating a leadframe according to the present invention. FIG. 2(a) is a plan view illustrating a land lead 4 and a lead 5 according to the first embodiment. FIG. 2(b) is a cross-sectional view of the lead 5 taken along the line IIb—IIb shown in FIG. 2(a). And FIG. 2(c) is a cross-sectional view of the land lead 4 taken along the line IIc—IIc shown in FIG. 2(a). In FIG. 1, the two-dot chain indicates a molding region where a semiconductor chip will be mounted on the leadframe of this embodiment and these members will be molded together with a resin encapsulant.

As shown in FIGS. 1, 2(a), 2(b) and 2(c), the leadframe of this embodiment is a platelike member made of a metal like copper or Alloy 42 for use in normal leadframes. The leadframe includes die pad 1, frame rail 2, support leads 3, linear land leads 4 and linear leads 5. The die pad 1 is used for mounting a semiconductor chip thereon. One end of each support lead 3 is connected to the frame rail 2, while the other end thereof supports one of the four corners of the die pad 1. One end of each of the land leads 4 and leads 5 extends toward the die pad 1, while the other end thereof is connected to the frame rail 2. The land leads 4 and the leads 5 are equivalent to the second and first groups of leads, respectively, as defined in the appended claims. The respective bottoms of the land leads 4 and leads 5 are used as external terminals (or land portions). In addition, not only the bottom but also the outer side face of each lead 5 serve as an external terminal that can be connected to a motherboard. The inner free end of the land lead 4 is closer to the die pad 1 than that of the lead 5 is.

Specifically, the die pad 1 includes a circular, protruding portion 6. The protruding portion 6 protrudes upward from around the center of the upper surface of the die pad 1 (as will be described later with reference to FIG. 5). The protruding portion 6 can be formed by half-cutting part of a flat plate for the die pad 1 and making that part protrude upward by pressworking. A semiconductor chip will actually be supported on this protruding portion 6. Thus, when the semiconductor chip is mounted on that portion 6, a gap will be created between the surface of the die pad 1, except for the protruding portion 6, and the backside of the semiconductor chip. A groove 7 is also formed in the upper surface of the die pad 1 to surround the protruding portion 6. Accordingly, when the semiconductor chip is bonded onto the die pad 1 and molded with a resin encapsulant, the resin encapsulant will enter the groove 7. In the illustrated embodiment, the groove 7 is formed in an annular shape. When the semiconductor chip is molded with a resin encapsulant after having been bonded and fixed onto the protruding portion 6 of the die pad 1 with an adhesive, the resin encapsulant is received at the groove 7. Accordingly, even if a stress, resulting from thermal expansion, has peeled the resin encapsulant off the surface of the die pad 1, that peeled part of the resin encapsulant can be trapped at the groove 7, thus preventing the reliability of the resin-molded semiconductor device from decreasing. Although the groove 7 is annular according to this embodiment, the groove 7 may also be in the shape of a discontinued ring. Also, two or more grooves 7, e.g., three or four grooves, may be formed. In short, the shape and number of the groove(s) may be appropriately selected depending on the size of the die pad 1 and that of the semiconductor chip to be mounted thereon.

Also, in this embodiment, the land leads 4 and leads 5 are arranged alternately and parallelly when connected to the frame rail 2. As viewed from above, the inner free ends of the land leads 4 and leads 5 are arranged like a hound's-tooth check. And the respective inner ends of the land leads 4 are closer to the die pad 1 than those of the leads 5 are. This arrangement is selected such that when the semiconductor chip is mounted and molded with a resin encapsulant, the bottoms of these inner ends of the land leads 4 and leads 5 are arranged like a hound's-tooth check on the bottom of the package. And these bottoms will be used as external terminals arranged in two lines. As shown in FIG. 2(a), the land lead 4 is a linear lead including a curved land portion 8 at its end functioning as an external terminal. Also, as shown in FIG. 2(c), the land portion 8 has an original thickness, which is greater than the thickness of the other portions that has been reduced by half-etching.

More specifically, the land portion 8 of the land lead 4 protrudes downward, and the upper surface of the land lead 4 is greater in area than the lower surface thereof. In FIG. 1, the dashed line indicates the land portion 8 on the bottom of the land lead 4. In FIG. 2(a), the cross-hatched regions indicate the half-etched portions of the land lead 4. Like the land lead 4, the outer edge of the lead 5 also has its thickness reduced by half etching, a wide portion 9 is provided at the end of the lead 5 and a groove 10 is formed at around the root of the wide portion 9 as shown in FIGS. 2(a) and 2(b). A land portion with a curved edge is also formed on the bottom of the lead 5. In FIGS. 1 and 2(a), the hatched region indicates the groove 10. If a semiconductor chip is mounted on the leadframe of this embodiment and molded with a resin encapsulant, then just one side of the package will be sealed and the bottom and the side face of the lead 5 will be exposed. Accordingly, unlike the conventional fully-molded package, some stress might be applied to the leads 5 during resin molding or after the package has been mounted on the motherboard. Even so, that stress can be cushioned by the grooves 10, thus preventing the metal fine wires from being disconnected and keeping the assembled product highly reliable. In this case, the surface of the land portion 8 of the land lead 4 and the wide portion 9 of the lead 5 will be bonding pads to which the metal fine wires will be connected.

In the leadframe of this embodiment, the land leads 4 and leads 5 are both linear leads, and the land portion 8 on their bottom has a curved edge. Also, since the land leads 4 and leads 5 are arranged alternately, the land portions 8 of these leads 4 and 5 form a hound's-tooth check on the bottom of the package.

Figure 4:
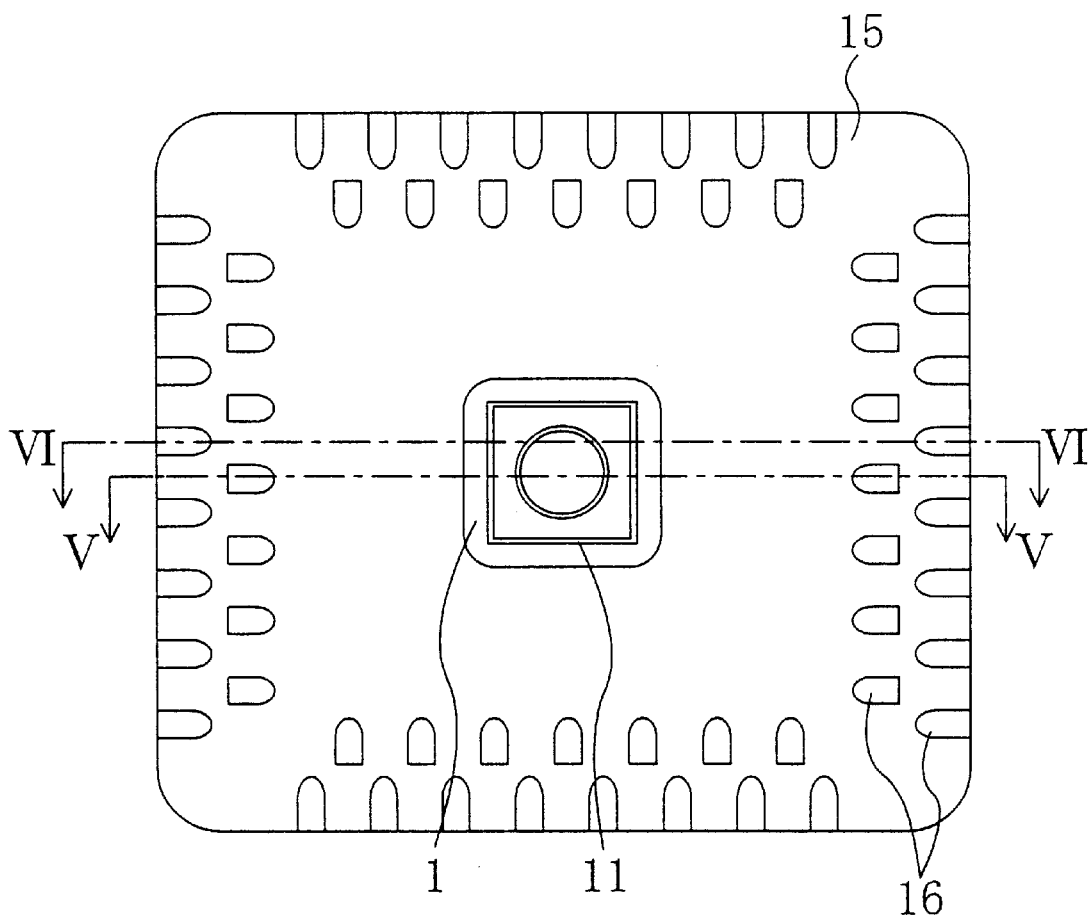
FIG. 4 is a bottom view of the inventive resin-molded semiconductor device.
Figure 5:
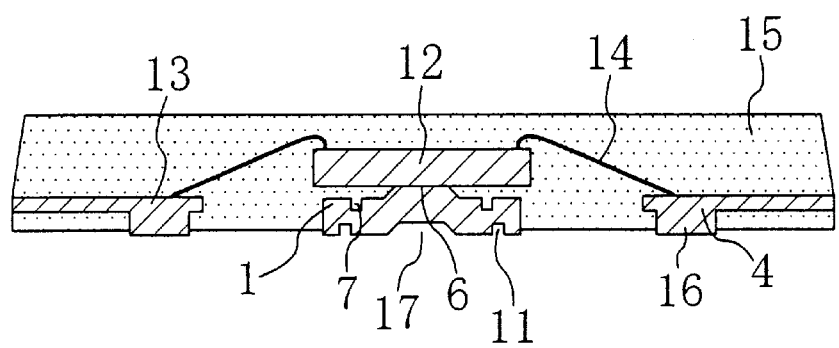
FIG. 5 is a cross-sectional view of the resin-molded semiconductor device taken along the line V—V shown in FIGS. 3 and 4.

As shown in FIGS. 4 and 5, a rectangular (or annular) groove 11 is formed in the bottom of the die pad 1 of the leadframe according to the first embodiment. As can be seen from the bottom view illustrated in FIG. 4, the bottom of the protruding portion 6 is encircled with the groove 11. When the package is bonded onto a motherboard with solder or any other bonding member applied to the bottom of the die pad 1, the solder does not expand more than necessarily, since the groove 11 receives the solder. As a result, the package can be mounted more accurately. In addition, the stress applied by the die pad 1 itself, resulting from the heat dissipated from the semiconductor chip, can also be cushioned. In the illustrated embodiment, just one groove 11 is provided. optionally, to further improve the mounting accuracy, another one, two or more annular grooves may be additionally formed around the outer periphery of the bottom of the die pad 1.

Furthermore, each of the support leads 3 may have a dummy land portion or bent portion.

The number of the land leads 4 or leads 5 may be appropriately selected depending on the number of pins of a semiconductor chip to be mounted on the leadframe.

Also, according to the first embodiment, the surface of the leadframe may plated with a stack of metal layers, e.g., nickel (Ni), palladium (Pd) and gold (Au) layers, if necessary.

When a resin-molded semiconductor device is formed by mounting a semiconductor chip on the leadframe of this embodiment, connecting the chip to the leads with metal fine wires and molding these members together with a resin encapsulant, a land grid array (LGA) package can be obtained. That is to say, two lines of external terminals are arranged like a hound's-tooth check on the bottom of the resin-molded semiconductor device (or the package). Specifically, as shown in FIG. 4, the land portions 8 of the land leads 4 with a curved edge have their bottoms exposed along the inner one of these two lines, while those of the leads 5 with a curved edge also have their bottoms exposed along the outer line.

A resin encapsulant might peel off after the members have been molded with the resin encapsulant while a resin-molded semiconductor device is being formed using the leadframe of the first embodiment. However, that peeled resin encapsulant can be received at the groove 7 formed in the upper surface of the die pad 1. As a result, the resin-molded semiconductor device can be greatly reliable. In addition, the heat can be dissipated from the device more efficiently, the package can be bonded onto a motherboard with solder more accurately and the area of a mountable semiconductor chip can be increased.

Figure 3:
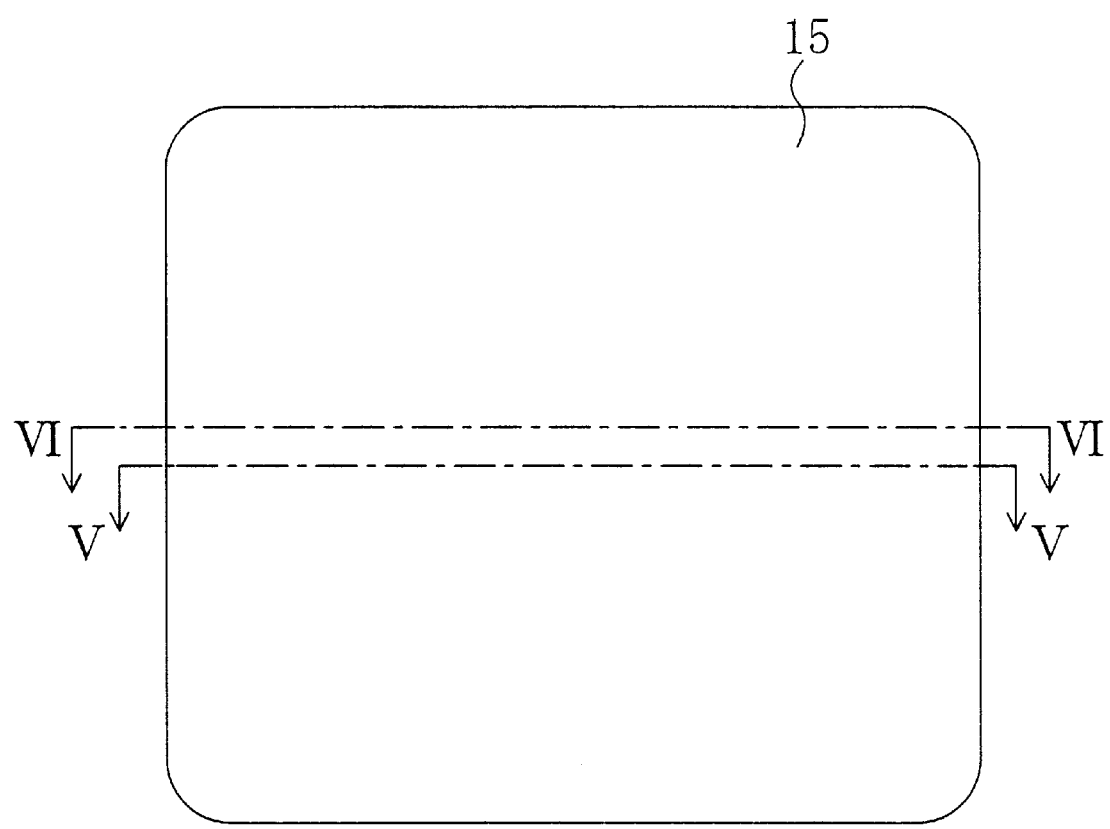
FIG. 3 is a top view of a resin-molded semiconductor device according to the present invention.
Figure 6:
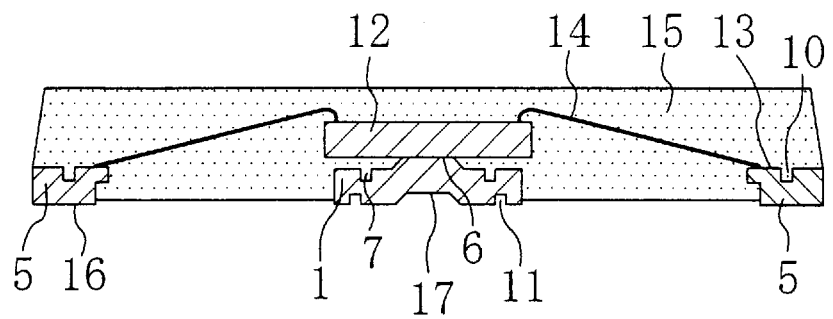
FIG. 6 is a cross-sectional view of the resin-molded semiconductor device taken along the line VI—VI shown in FIGS. 3 and 4.

Next, a resin-molded semiconductor device, which has been formed by using the leadframe shown in FIGS. 1, 2(a), 2(b) and 2(c), will be described with reference to the accompanying drawings. FIGS. 3 and 4 are respectively top and bottom views of a resin-molded semiconductor device according to the first embodiment. FIGS. 5 and 6 are cross-sectional views of the device taken along the lines V—V and VI—VI, respectively, shown in FIGS. 3 and 4.

As shown in FIGS. 3, 4, 5 and 6, the resin-molded semiconductor device of the first embodiment includes the die pad 1, semiconductor chip 12, leads 5, land leads 4, metal fine wires 14 and resin encapsulant 15. As described above, the die pad 1 has the protruding portion 6 and groove 7 on its upper surface and the annular groove 11 on its bottom. The groove 7 surrounds the protruding portion 6 on the upper surface and may be circular, rectangular or any other complex shape. The semiconductor chip 12 has been bonded onto the protruding portion 6 of the die pad 1 with a conductive adhesive (not shown) such as silver paste. Each of the leads 5 has the groove 10 on its upper surface and has its bottom exposed on the bottom of the package. Each of the land leads 4 extends toward the die pad 1 and the inner end of the land lead 4 is closer to the die pad 1 than that of each lead 5 is. Each of the land leads 4 has its bottom exposed on the bottom of the package and used as the land electrode 16. The metal fine wires 14 electrically connect the electrode pads (not shown) on the principal surface of the semiconductor chip 12 to the bonding pads 13 of the land leads 4 and leads 5. And all of these members 1, 12, 5, 4 and 14 are molded together within the resin encapsulant 15 except for the bottom of the die pad 1, respective bottoms of the land leads 4 and leads 5 and respective outer side faces of the leads 5. The respective bottoms of the land leads 4, exposed on the bottom of the resin encapsulant 15, and the respective side faces and bottoms of the leads 5, exposed on the bottom and side faces of the resin encapsulant 15, are used as the land electrodes 16. These land electrodes 16 will be external terminals when the package is mounted onto a motherboard like a printed wiring board. These bottoms of the leads 5 and land leads 4 are exposed out of the resin encapsulant 15 and arranged in two lines like a hounds,-tooth check. Each of the land electrodes 16 is exposed and protrudes out of the resin encapsulant 15 by about 20 μm, thus providing a standoff height needed in mounting the package onto the motherboard. In the same way, the exposed bottom of the die pad 1 also protrudes out of the resin encapsulant 15. Accordingly, after the package has been mounted onto the motherboard, heat, generated from the semiconductor chip 12, can be dissipated more efficiently toward the motherboard through the solder joint.

In addition, the bottom of the die pad 1 is further provided with a concave portion 17. As described above, the half-cut protruding portion 6 is formed on the upper surface of the die pad 1 by pressworking. Accordingly, the depth of the concave portion 17 is substantially equal to the height of the protruding portion 6. In the illustrated embodiment, the die pad 1 is made of a metal plate (i.e., the leadframe) with a thickness of 200 μm. And the height of the protruding portion 6 may be between 140 μm and 180 μm, i.e., 70 to 90% of the thickness of the metal plate.

The area of the bonding pad 13 of the land leads 4 and leads 5 is preferably large enough to enable wire bonding, e.g., 100 μm² or more, and small enough to make the electrodes arrangeable at a high density needed for realizing a downsized and thinned resin-molded semiconductor device.

By utilizing the structure of this embodiment, a high-density face-bonded resin-molded semiconductor device, which can cope with the recent increase in number of pins, is implementable.

According to the present invention, the thickness of the package (or the resin-molded semiconductor device) itself can be reduced to as small as 1 mm or less, e.g., 800 μm.

In this manner, the resin-molded semiconductor device of the first embodiment can be a land grid array (LGA) package. That is to say, external terminals are arranged in two lines like a hound's-tooth check on the bottom of the package. Specifically, the land electrodes 16 of the land leads 4 have their bottoms exposed along the inner one of the two, while the land electrodes 16 of the leads 5 also have their bottoms exposed along the other outer line. Also, even if the resin encapsulant 15 has peeled off between the backside of the semiconductor chip 12 and the upper surface of the die pad 1, that peeled resin encapsulant can be received at the groove 7 formed in the upper surface of the die pad 1. As a result, the resin-molded semiconductor device can be kept reliable. In addition, the heat can be dissipated from the device more efficiently, the package can be bonded with solder onto a motherboard more accurately and the area of a mountable semiconductor chip can be increased.

Furthermore, the resin-molded semiconductor device of the first embodiment is an LGA type device that can be bonded onto a motherboard using only the leadframe and does not need any additional wiring or circuit board necessary for the conventional LGA device. And yet the inventive device can be bonded onto the motherboard more strongly.

Figure 7:
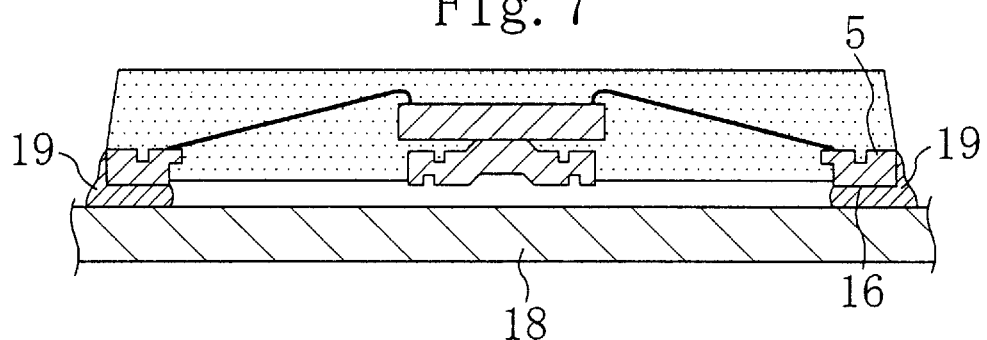
FIG. 7 is a cross-sectional view illustrating how the resin-molded semiconductor device may be mounted on a motherboard.

FIG. 7 is a cross-sectional view illustrating how the resin-molded semiconductor device of the first embodiment shown in FIG. 6 may be mounted on a motherboard. As shown in FIG. 7, the device of this embodiment may be mounted onto a motherboard 18 (e.g., a printed wiring board) by bonding the land electrodes 16, exposed on the bottom of the package, to the motherboard 18 with an adhesive 19 such as solder. The land electrodes 16 of the land leads 4 are bonded to the motherboard 18 with the adhesive 19 that has been attached only to the bottoms of the electrodes 16 (not shown in FIG. 7). On the other hand, as shown in FIG. 7, the land electrodes 16 of the leads 5 are bonded to the motherboard 18 with the adhesive 19 that has been attached not only to the bottoms of the electrodes 16 but also to the side faces of the leads 5. This is possible because the outer side faces of the leads 5 are exposed according to this embodiment.

In a known LGA resin-molded semiconductor device, only the bottoms of land electrodes are bonded to a motherboard with an adhesive. In contrast, according to this embodiment, the outer side faces of the leads 5, which form the outer line of land electrodes 16 on the bottom of the package, are exposed out of the package (or the resin encapsulant 15). Thus, it is possible to apply the adhesive 19 to those side faces as well. That is to say, the leads 5, forming the outer line of land electrodes 16, can be bonded to the motherboard 18 with the adhesive 19 on two sides, i.e., their bottoms and their outer side faces. As a result, the package can be bonded onto the motherboard more strongly and more reliably.

According to this embodiment, the land electrodes are arranged in two lines that correspond to the land leads and leads, respectively. In addition, the land electrodes, arranged along the outer line, have their side faces exposed out of the resin encapsulant. Thus, it is possible to provide additional portions to be connected to the motherboard for the side faces of the package. A two-side (i.e., bottom and side faces) bonding structure like this has never been applied to the bonding of the package to the motherboard by any other known LGA resin-molded semiconductor device using a leadframe. Thus, the inventive structure realizes much more reliable bonding and is very advantageous.

When a resin-molded semiconductor device is formed by mounting a semiconductor chip on the leadframe of this embodiment and molding them together with a resin encapsulant, land electrodes, electrically connected to the chip, can be arranged in two line or like a hound's-tooth check on the bottom of the package. In this manner, a face-bonded semiconductor device can be obtained. Accordingly, compared to the known bonding technique using leads, the package can be bonded to the motherboard much more reliably.

In addition, the inventive resin-molded semiconductor device does not include any circuit board with land electrodes unlike a known BGA semiconductor device. Instead, according to the present invention, an LGA semiconductor device is formed with a metal plate shaped into a leadframe. Thus, the inventive semiconductor device is far more advantageous than the known BGA semiconductor device in mass-productivity and manufacturing cost.

Next, an exemplary method for manufacturing the inventive resin-molded semiconductor device will be described with reference to the accompanying drawings. FIGS. 8, 9, 10, 11, 12 and 13 are cross-sectional views illustrating respective process steps for manufacturing the resin-molded semiconductor device according to the first embodiment. In the following description, a method for manufacturing an LGA resin-molded semiconductor device using the leadframe shown in FIG. 1 will be exemplified. Also, only the cross-sectional views taken along the line V—V shown in FIGS. 3 and 4 (i.e., cross sections passing the land leads 4) will be referred to for convenience sake. Accordingly, no leads 5 are illustrated in any of FIGS. 8 through 13.

Figure 8:
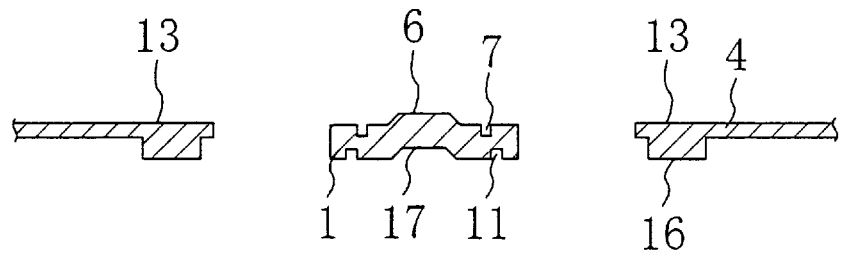
FIGS. 8, 9, 10, 11, 12 and 13 are cross-sectional views illustrating respective process steps for manufacturing the resin-molded semiconductor device according to the present invention.

First, as shown in FIG. 8,. a leadframe, including the frame rail, die pad 1, support leads (not shown in FIG. 8), leads (not shown in FIG. 8) and land leads 4, is prepared. The frame rail is formed out of a metal plate. The die pad 1 for mounting a semiconductor chip thereon is disposed within the opening of the frame rail. One end of each support lead supports the die pad 1, while the other end thereof is connected to the frame rail. The bottoms of the leads will be used as land electrodes that are arranged in line at regular intervals. Each of these leads has a wide bonding pad portion, to which a metal fine wire will be connected, on the surface of its inner end, while the other outer end thereof is connected to the frame rail. A groove is formed near the inner end of each lead. The bottoms of the land leads 4 will also be used as land electrodes. Each of these land leads also has a wide bonding pad portion 13, to which a metal fine wire will be connected, on the surface of its inner end, while the other outer end thereof is connected to the frame rail. The upper surface of each land lead 4 is greater in area than the lower surface thereof. And the respective inner ends of the leads and land leads 4 are alternately arranged in two lines like a hound's-tooth check. The die pad 1 has a protruding portion 6 and a circular or rectangular groove 7, surrounding the protruding portion 6, on its upper surface, and also has an annular groove 11 and a concave portion 17 on its lower surface.

Figure 9:
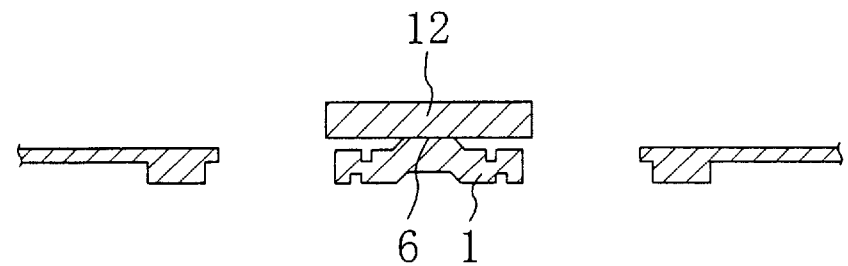

Next, as shown in FIG. 9, a semiconductor chip 12 is mounted and bonded, with a conductive adhesive like silver paste, onto the protruding portion 6 of the die pad 1 of the leadframe prepared. In this case, the semiconductor chip 12 is placed with its circuitry side (or its principal surface) facing upward.

Figure 10:
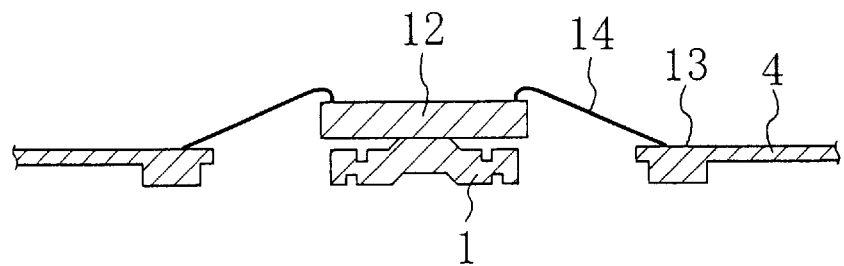

Then, as shown in FIG. 10, electrode pads, formed on the principal surface of the semiconductor chip 12 on the die pad 1, are electrically connected, with metal fine wires 14, to the bonding pads 13 on the upper surfaces of the land leads 4 and leads (not shown) of the leadframe. In the illustrated embodiment, the area of each of these bonding pads 13, to which the metal fine wire 14 is connected, is 100 $\mu^2$ or more.

Figure 11:
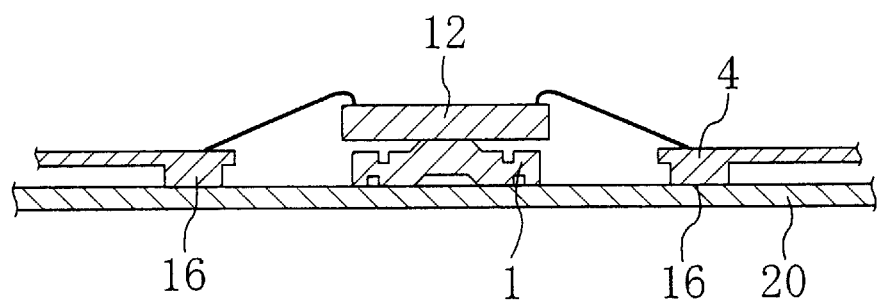

Subsequently, as shown in FIG. 11, a seal tape or seal sheet 20 is closely attached to the backside of the leadframe, i.e., to the bottom of the die pad 1, the land electrodes of the land leads 4 and the bottoms of the leads (not shown). The seal sheet 20 used in this process step is made of a plastic material that is not adhesive to the leadframe but can be easily peeled off after the resin encapsulation. By using this seal sheet 20, the resin encapsulant cannot reach the backside of the leadframe during a resin molding process step and therefore no resin bur will be deposited on the bottoms of the die pad 1, land leads 4 and leads (not shown). Thus, a water jet process step, which is normally carried out for deburring purposes after the resin molding, can be omitted.

Figure 12:
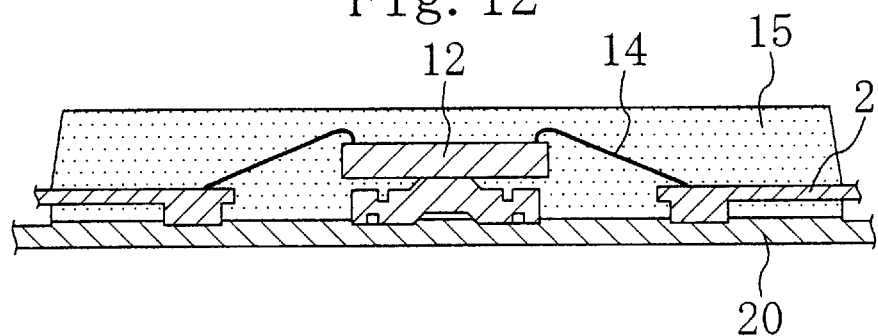

Thereafter, as shown in FIG. 12, the exposed upper surface of the leadframe with the die pad 1, the semiconductor chip 12 on the leadframe, metal fine wires 14 and so on, are molded together with a resin encapsulant 15 with the seal sheet 20 attached to the backside. This process step is ordinarily performed by a single-side-molding technique, i.e., transfer molding using a die assembly consisting of upper and lower dies divided. In this case, since the bottoms of the die pad 1, land leads 4 and leads (not shown) are not covered with the resin encapsulant 15, a "single-side-molded structure" is obtained. Particularly, portions of the land leads 4 and leads, which are connected to the frame rail 2 (i.e., portions that have not been molded with the resin encapsulant 15), are preferably pressed by the upper die against the lower die with the seal sheet 20 interposed therebetween. In that case, the resin molding process can be performed with the bottoms of the land leads 4 and leads strongly pressed and forced into the seal sheet 20. As a result, no resin bur will be left on these bottoms and a standoff height is ensured, because these bottoms of the land leads 4 and leads will protrude downward from the bottom of the package (i.e., the bottom of the resin encapsulant 15).

The seal sheet 20 may be closely attached or adhered to the backside of the leadframe in any of various manners. For example, the seal sheet 20 may be placed in advance on the lower die of the die assembly and then attached to the leadframe before the resin molding process is carried out. Alternatively, the seal sheet 20 may be attached in advance to the leadframe before the resin molding process is carried out, and then the assembly with the seal sheet may be introduced into the die assembly and molded with the resin encapsulant.

Figure 13:
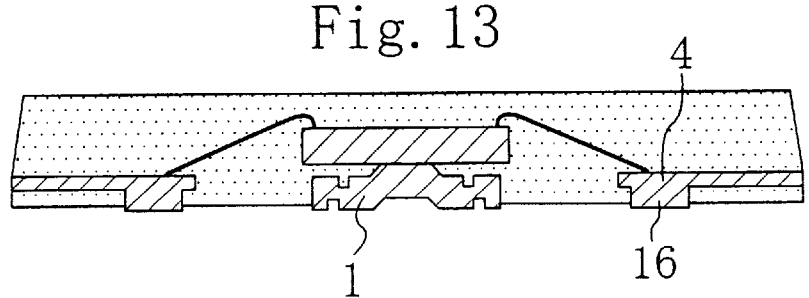

Next, as shown in FIG. 13, after the resin molding process is over, the seal sheet 20 is peeled off, for example, and then portions of the support leads, land leads 4 and leads, which have been connected to the frame rail, are cut off. In this process step, these leads are cut off such that the respective ends of the leads are substantially flush with the side faces of the resin-molded package. As a result, the bottoms of the land leads 4 and leads become land electrodes 16, the outer side faces of the leads becomes external electrodes and the bottom of the die pad 1 is exposed to easily dissipate heat therefrom.

By the method for manufacturing a resin-molded semiconductor device according to this embodiment, a package with a backside structure such as that illustrated in FIG. 4 is obtained. Specifically, as the package is viewed from below, land electrodes are arranged in two lines along the four sides of the package. That is to say, the land electrodes 16 of the land leads 4 have their bottoms exposed along the inner line, while the land electrodes of the leads have their bottoms exposed along the outer line. In this manner, a land grid array (LGA) package, including external terminals arranged in two lines like a hound's-tooth check, is formed. Alternatively, an LGA package, including two lines of parallelly arranged external terminals, may also be formed.

In addition, according to the inventive method for manufacturing a resin-molded semiconductor device, land electrodes are arranged in two lines for two different types of leads. Thus, it is also possible to provide connection portions on the outer side faces of the package. That is to say, since the resin-molded semiconductor device can be bonded onto a motherboard on two sides (i.e., bottom and side faces), the device can be bonded much more strongly and reliably.

Embodiment 2

The leadframe structure of the first embodiment still has some parts to be further modified.

Figure 14A:
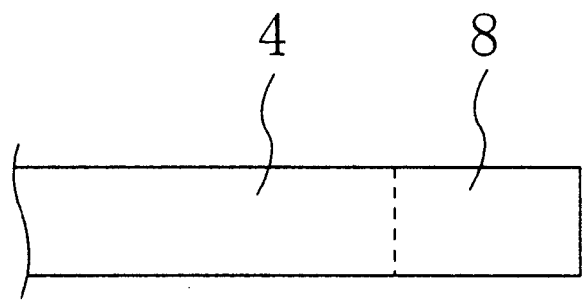
FIGS. 14(a) and 14(b) are respectively partial plan view and partial cross-sectional view illustrating, on a larger scale, part of the land lead according to the first embodiment.
Figure 14B:
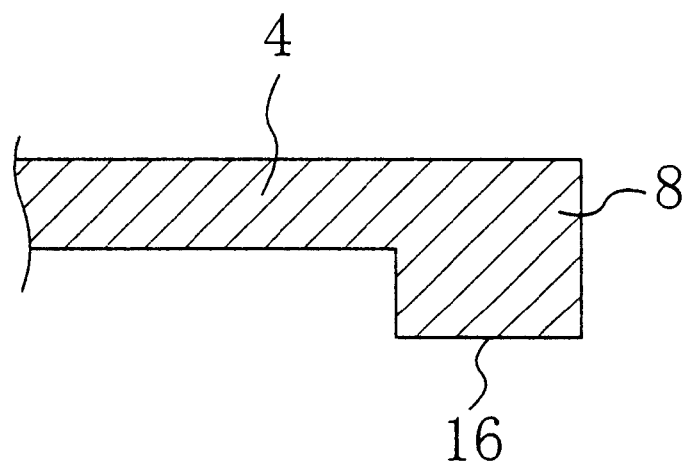
Figure 15:
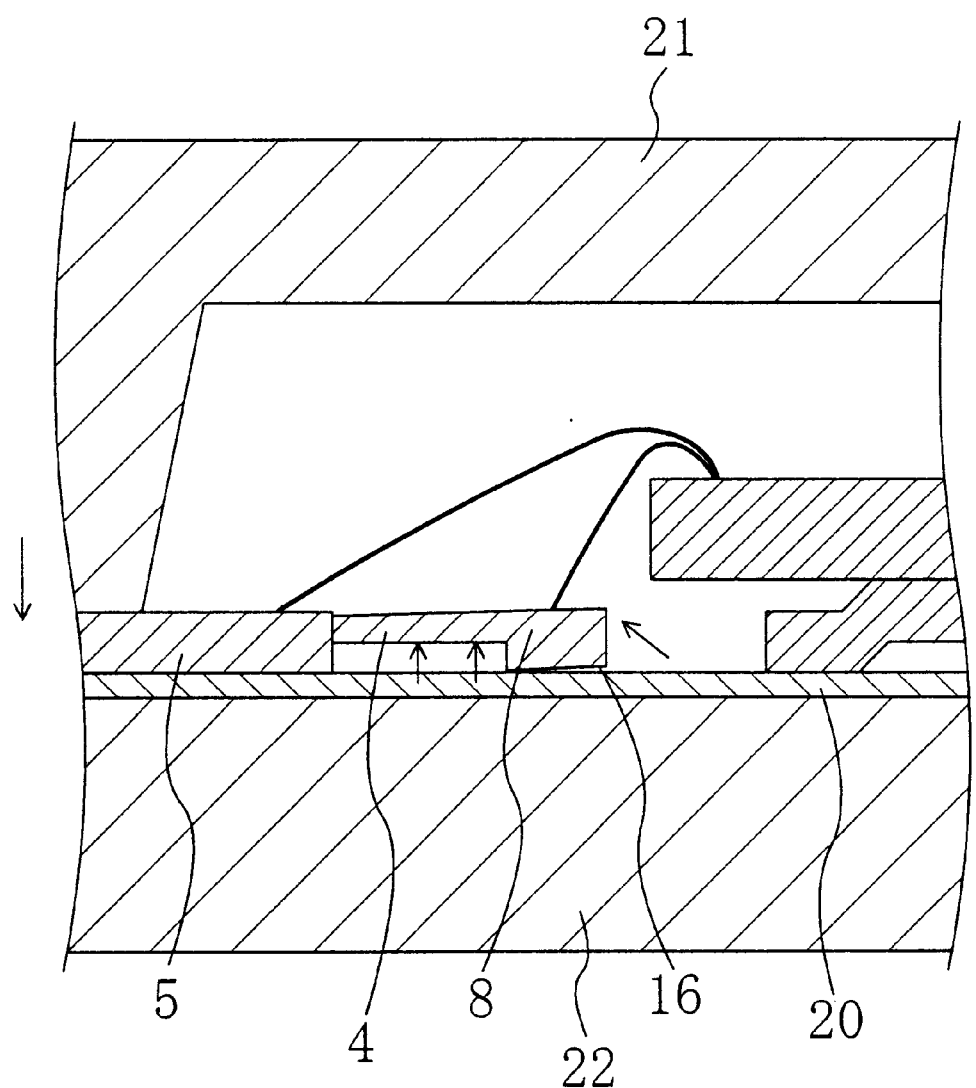
FIGS. 15 and 16 are partial cross-sectional views illustrating how respective members of the resin-molded semiconductor device may be molded with a resin encapsulant in the first embodiment.
Figure 16:
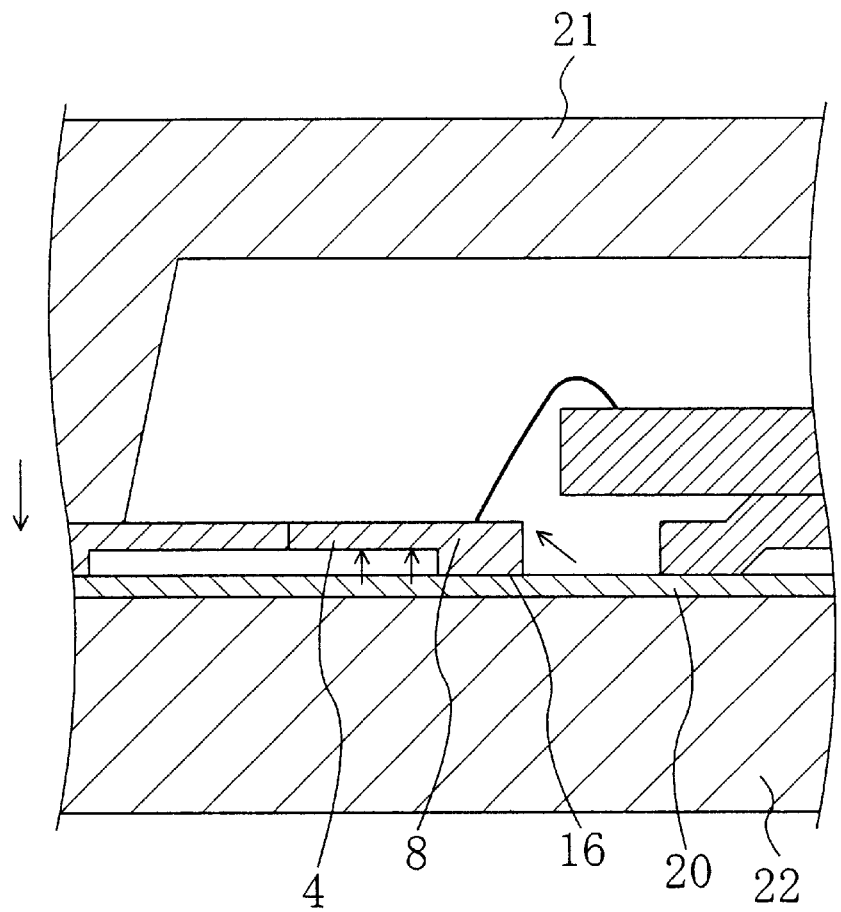
Figure 17:
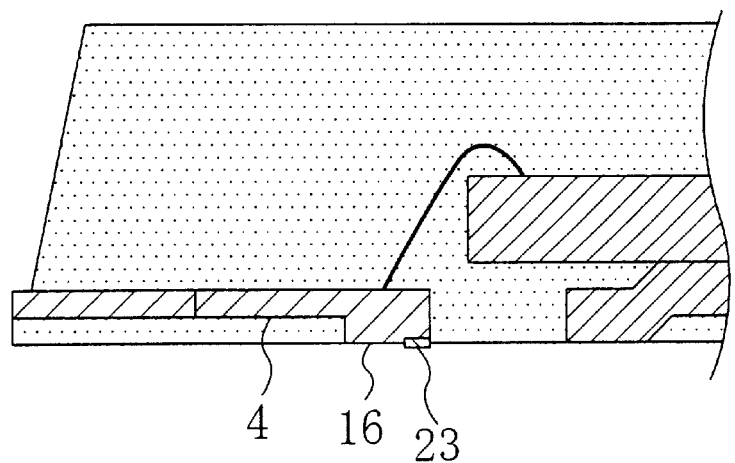
FIG. 17 is a partial cross-sectional view of the resin-molded semiconductor device of the first embodiment, in which resin bur is left during a resin molding step.

Hereinafter, modifications applicable to the leadframe of the first embodiment will be described with reference to the accompanying drawings. FIGS. 14(a) and 14(b) are respectively partial plan view and partial cross-sectional view illustrating, on a larger scale, part of the land lead 4 (i.e., lead on the second line) of the leadframe according to the first embodiment. FIGS. 15 and 16 are partial cross-sectional views illustrating how the land lead 4 and lead 5 are affected by a stress applied by a resin encapsulant being injected during a resin molding process. FIG. 17 is a partial cross-sectional view illustrating what resin-molded semiconductor device will be formed when the stress is applied to those leads 4 and 5.

As shown in FIGS. 14(a) and 14(b), the land lead 4 (i.e., the lead of the second group) has the land portion 8 at its inner end and only the bottom of the land portion 8 will be the land electrode 16. During a resin molding process, the outer end of the land lead 4 (i.e., the end located closer to the frame rail) is pressed by a first upper die 21 against a second lower die 22 via the seal sheet 20 as shown in FIG. 15. However, since the land portion 8 at the inner end of the land lead 4 is relatively distant from the point where the land lead 4 is pressed by the first die 21, the land electrode 16 on the bottom of the land portion 8 cannot strongly adhere to the seal sheet 20. Accordingly, while a resin encapsulant is being injected in the direction indicated by the arrows in FIG. 15, the injection pressure is likely to lift the land electrode 16 on the bottom of the land portion 8 of the land lead 4 from the seal sheet 20. As a result, the land lead 4, which has been peeled off the seal sheet 20, will be molded with the resin encapsulant as it is. On the other hand, the inner end of the lead 5 (i.e., lead of the first group) is relatively close to a point where the lead 5 is pressed by the first die 21. Thus, when the first die 21 is pressed downward, the bottom of the lead 5 will make tight contact with the seal sheet 20 and is not peeled off the sheet 20.

If the land lead 4 in such a state is molded with the resin encapsulant, then the resin encapsulant will reach the bottom of the land lead 4 (i.e., the land electrode 16) to leave resin bur 23 on the surface of the land electrode 16 of the land lead 4 as shown in FIG. 17. As a result, the land electrode 16 could not function as an external electrode properly. Thus, to solve a problem like this by getting the bottom of the land lead 4 strongly adhered to the seal sheet 20 and thereby eliminating the resin bur 23 will have a great significance in the pertinent art.

Hereinafter, a leadframe designed to solve this problem and a method for manufacturing a resin-molded semiconductor device using the leadframe will be described with reference to the accompanying drawings. In the following illustrative embodiment, a technique of getting the land electrode 16 of the land lead 4 strongly adhered to the seal sheet will be exemplified.

Figure 18A:
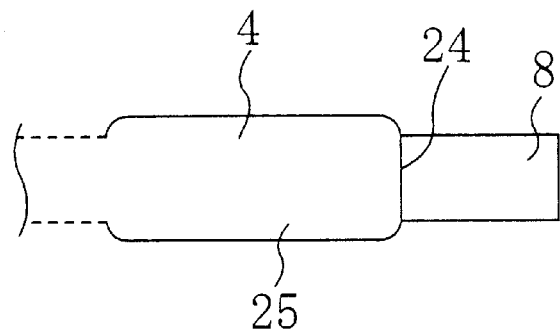
FIGS. 18(a) and 18(b) are respectively plan view and cross-sectional view illustrating a land lead for a leadframe according to a second embodiment of the present invention.
Figure 18B:
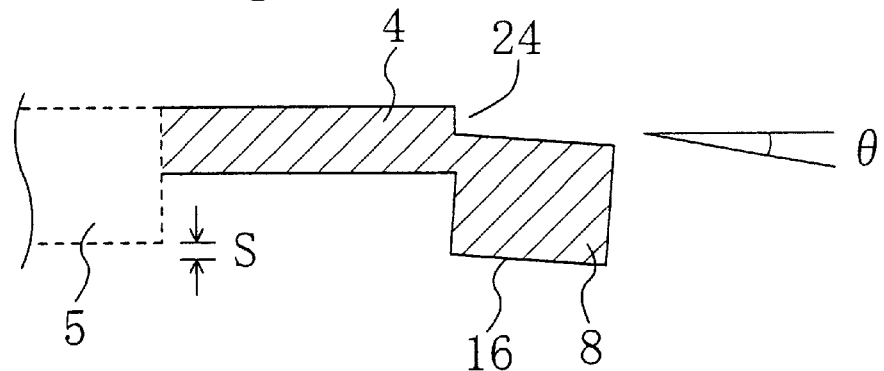

FIGS. 18(a) and 18(b) are. respectively plan view and cross-sectional view illustrating a land lead for a leadframe according to the second embodiment. The overall structure of the leadframe is basically the same as that illustrated in FIG. 1. However, the leadframe of the second embodiment is different from the counterpart of the first embodiment in the shape and function of the land leads 4, i.e., the leads of the second group. As will be described later, according to this embodiment, at least the land leads 4 are designed to be strongly forced into and adhered to the seal sheet. In FIG. 18(b), the dashed line indicates the lead 5, i.e., the lead of the first group, to show the level difference between the lower surface of the land electrode 16 and that of the lead 5.

As described above, the leadframe of the second embodiment has basically the same structure as that of the first embodiment. Thus, only the differences between these two embodiments will be described. As in the first embodiment, the leadframe of the second embodiment also includes the land leads on the inner line (i.e., the-leads of the second group) and the leads on the outer line (i.e., the leads of the first group). However, according to the second embodiment, the land lead 4 has a different shape as shown in FIGS. 18(a) and 18(b). More specifically, at least the land portion 8 of the land lead 4 is thicker than the other portion thereof, and the part of the land portion 8, including the land electrode 16 on the bottom, protrudes downward compared to the lower surface of the lead 5. That is to say, the land lead 4 has a half-cut portion 24, which is formed by half-cut pressworking, at around the root of the land portion 8, and the land portion 8 has been pressed down in its entirety. Accordingly, the lowermost edge of the land electrode 16 is lower than the bottom of the lead 5 by the space S that is shown in FIG. 18(b) and corresponds to the depth of the half-cut portion 24.

Furthermore, according to this embodiment, the entire land portion 8 is inclined downward at an angle θ with the principal surface of the leadframe. Accordingly, compared to a leadframe structure in which the entire land portion 8 is parallel to the principal surface of the leadframe, the lower edge of the land portion 8 can be forced into and adhered to the seal sheet more easily. In this case, the angle θ of inclination is preferably between 3 and 15 degrees, more preferably 5±1 degrees as defined in this embodiment. The level difference of the half-cut portion 24, formed by press-working, is 20 μm. The land lead 4 further includes a wide portion 25 connected to the land portion 8. The wide portion 25 is formed by pressing and extending the land lead 4 horizontally.

In the embodiment illustrated in FIGS. 18(a) and 18(b), the half-cut portion 24 is formed at around the root of the land portion 8 of the land lead 4, the entire land portion 8 has been pressed down to incline downward at the angle θ and the bottom of the land electrode 16 is lower than that of the lead 5. Accordingly, in the resin molding process, the pressure applied by the die strongly forces the bottom of the land lead 4, which will be the land electrode 16, into the seal sheet, and the bottom of the land lead 4 can make tight contact with the seal sheet without being lifted from the sheet. As a result, no resin encapsulant reaches, and no resin bur will be left on, the land electrode 16 of the land lead 4.

The level difference created by forming the half-cut portion 24 can be appropriately defined according to this embodiment depending on the distance between one end of the land lead 4, connected to the frame rail, and the other free end thereof and the pressure applied by the dies. Normally, if the thickness of the land lead 4 is about 200 μm, a level difference of about 20 μm is preferably formed by half-cut pressworking.

Next, an exemplary method for manufacturing a resin-molded semiconductor device using the leadframe of the second embodiment will be described.

In the manufacturing process of the resin-molded semiconductor device using the leadframe of the second embodiment, almost the same process steps as those of the first embodiment illustrated in FIGS. 8 through 13 will be performed. Thus, it will be described just how the land lead 4 changes its position during the resin molding process.

Figure 19:
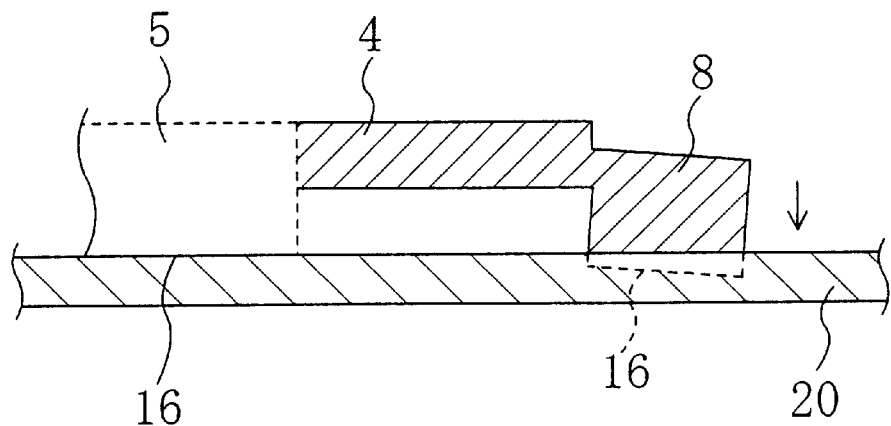
FIG. 19 is a cross-sectional view illustrating how a seal sheet is attached to a land lead of the leadframe according to the second embodiment.

FIG. 19 is a cross-sectional view how the land electrode 16 of the land lead 4 can make tight contact with the seal sheet 20 during a resin molding process using the leadframe of the second embodiment.

As shown in FIG. 19, the land portion 8 of the land lead 4 has been pressed down to be bent downward at the angle θ with the principal surface of the leadframe and its land electrode 16 has been pressed against, and strongly forced into, the seal sheet 20. Thus, the land electrode 16 can make tight contact with the seal sheet 20.

In the resin molding process using the seal sheet 20, at least the ends of the leads 5 and land leads 4 (i.e., the leads of the first and second groups) are pressed by the dies to force the land electrodes 16 of the leads 5 and land leads 4 into the seal sheet 20. In such a state, the respective members on the upper surface of the leadframe, i.e., the upper part of the die pad, the semiconductor chip and the metal fine wires, are molded together with the resin encapsulant. When this pressure is applied, the land electrodes 16 of the leads 5 are pressed against the seal sheet 20. Thus, the land electrodes 16 of the land leads 4, which have been pressed down to incline downward at the angle θ with the principal surface of the leadframe, are also pressed against and strongly forced into the seal sheet 20. As a result, the resin molding process can be performed with no resin encapsulant allowed to reach the land electrodes 16.

Thus, it is possible to prevent the land leads 4 from being lifted from the seal sheet 20. Since no gap is formed between the seal sheet 20 and the land electrodes 16 of the land leads 4, no resin encapsulant will reach, and no resin bur will be left on, the land electrodes 16. In FIG. 19, the arrow indicates that the pressure, applied by the resin encapsulant being injected, forces the land electrode 16 of the land lead 4 into the seal sheet 20.

Figure 20:
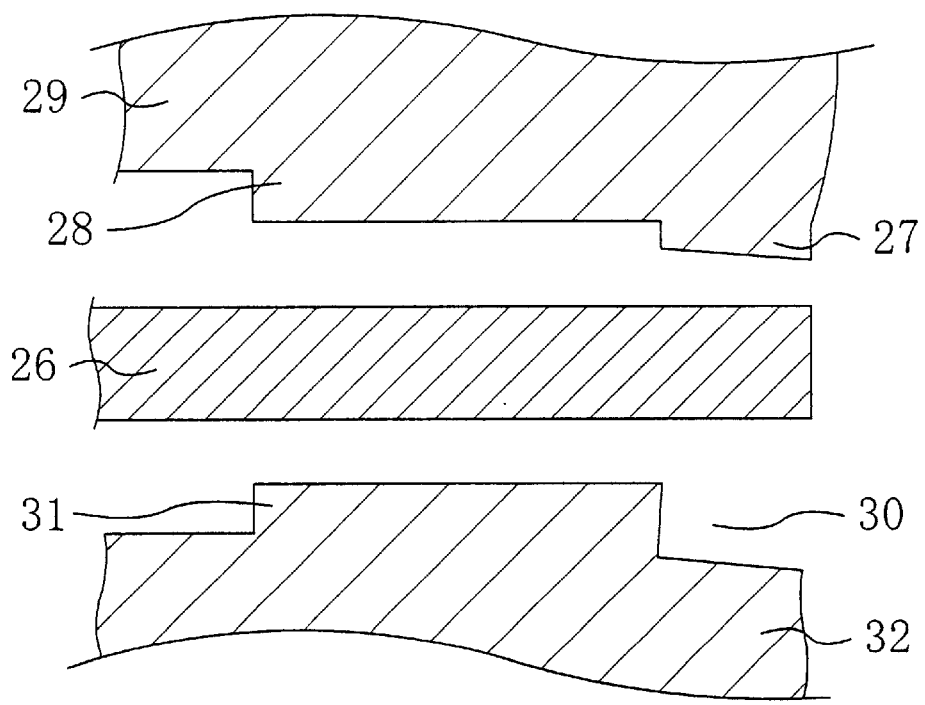
FIG. 20 is a cross-sectional view illustrating how to place a leadframe into press dies to form the land lead of the leadframe according to the second embodiment.
Figure 21:
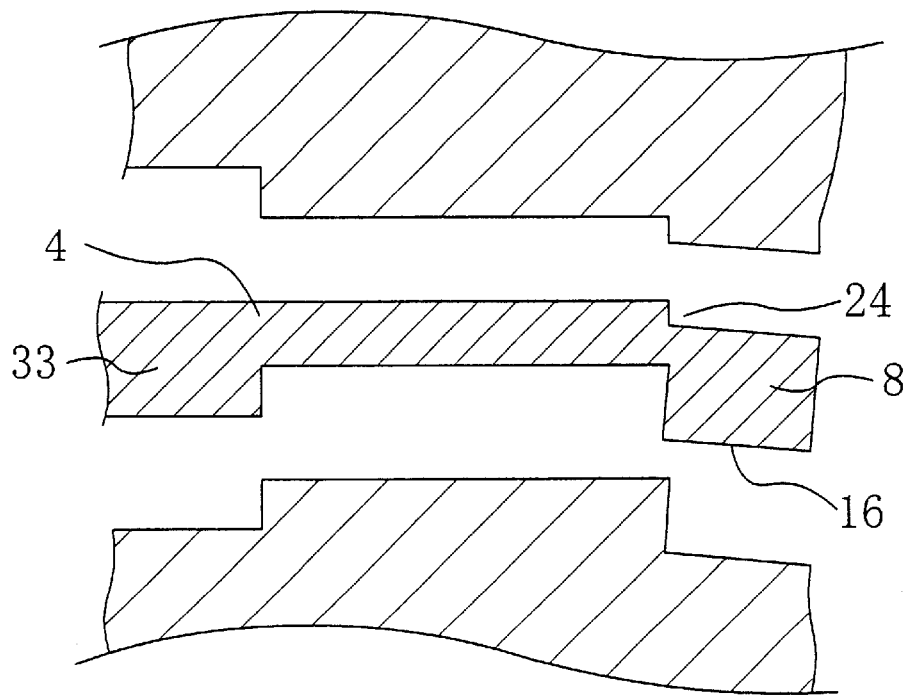
FIG. 21 is a cross-sectional view illustrating the land lead that has been formed out of the leadframe according to the second embodiment.
Figure 22:
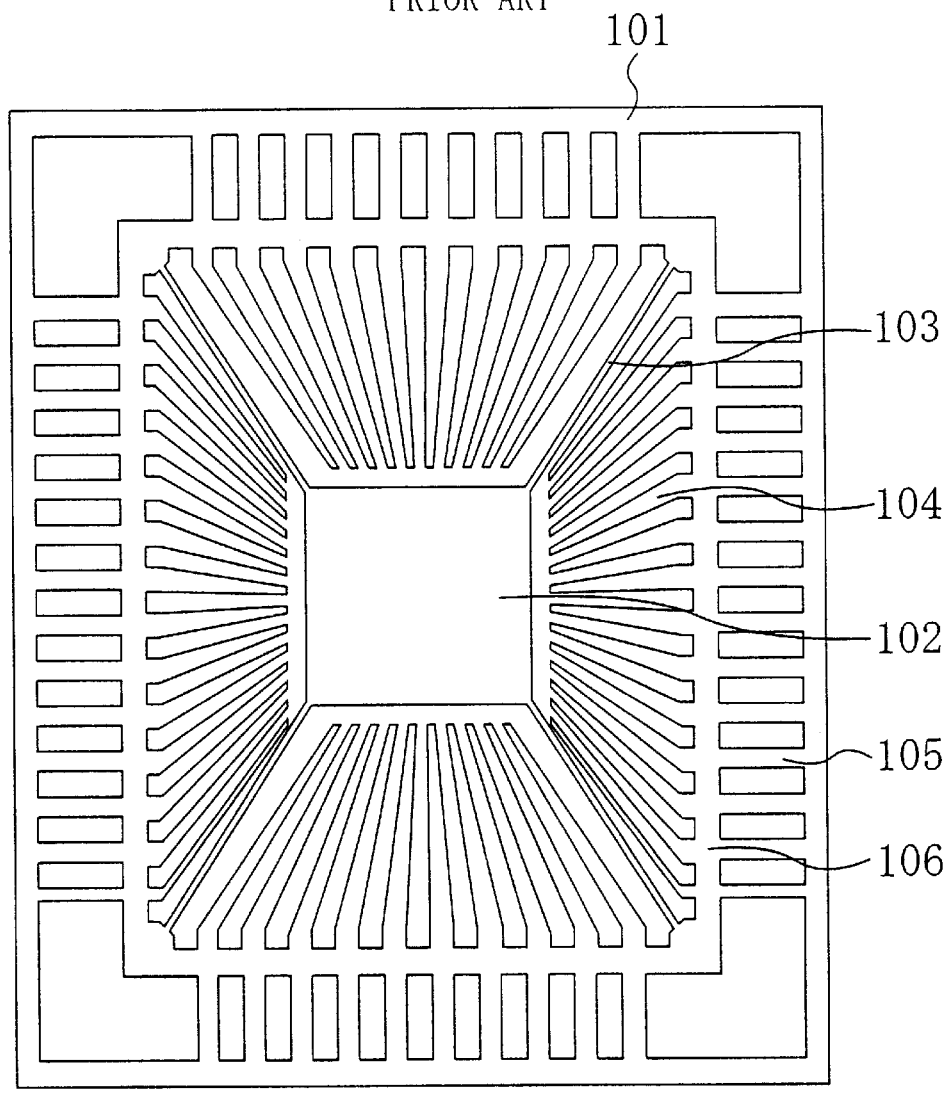
FIG. 22 is a plan view illustrating a conventional leadframe.
Figure 23:
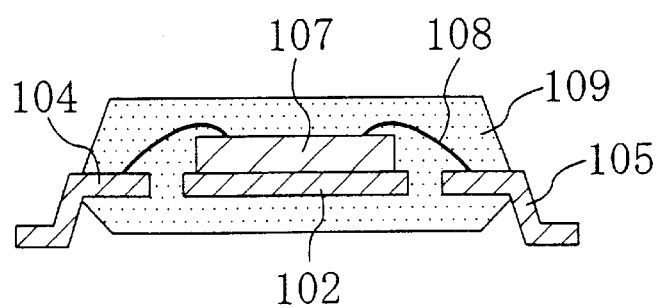
FIG. 23 is a cross-sectional view illustrating a conventional resin-molded semiconductor device.
Figure 24:
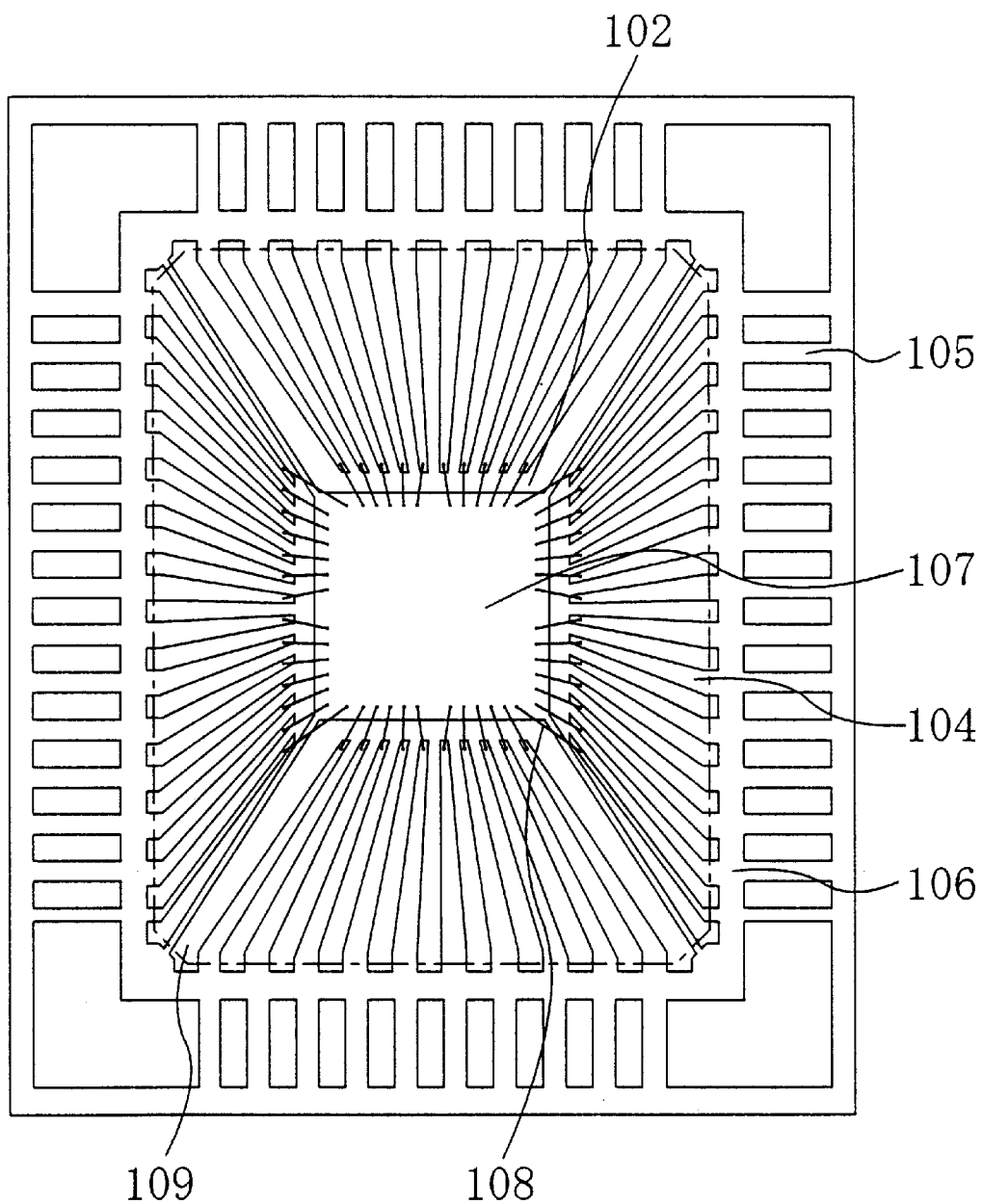
FIG. 24 is a plan view of the conventional resin-molded semiconductor device.

Next, it will be described with reference to FIGS. 20 and 21 how to shape the land lead of the leadframe according to the second embodiment. FIGS. 20 and 21 are cross-sectional views illustrating the land lead along with upper and lower dies.

First, as shown in FIG. 20, a relatively thick lead member 26, of which a land lead will be made, is sandwiched between upper and lower dies 29 and 32 and then shaped by pressworking. The upper die 29 includes a half-cut pressworking portion 27, inclined at the desired angle, and a pressing portion 28 for pressing and extending the lead member 26. On the other hand, the lower die 32 includes a concave portion 30 and a pressing portion 31, which correspond to the half-cut pressworking portion 27 and pressing portion 28 of the upper die 29, respectively.

In this case, the shapes of the half-cut pressworking portion 27 and concave portion 30 of the upper and lower dies 29 and 32 are defined such that the land portion and half-cut portion will be formed at the end of the lead member 26 and at the root of the land portion, respectively, and that the entire land portion will be pressed down and inclined downward at the angle θ with the principal surface of the leadframe. Also, except for parts of the lead member 26 connected to the land portion and the frame rail of the leadframe, respectively, the lead member 26 is pressed and extended horizontally (i.e., compressed vertically) by the pressing portions 28 and 31 of the upper and lower dies 29 and 32. As a result, that pressed part of the lead member 26 has its thickness reduced and extended horizontally to form the wide portion.

As shown in FIG. 21, except for at least the land portion 8 and the inner end 33, the land lead 4 is relatively thin, and the land portion 8 including the land electrode 16 protrudes and inclines downward at the angle θ. In this land lead 4, the half-cut portion 24 is formed by half-cut press-working at around the root of the land portion 8, the land portion 8 itself has been pressed down and the land electrode 16 thereof is lower than that of the lead 5. In the illustrated embodiment, the thinned portion of the land lead 4 has a thickness of 130 μm when the lead member 26 has a thickness of 200 μm. That is to say, a level difference of 70 μm has been formed. On the other hand, the land portion 8 has a level difference of 20 μm, which has been created by the half-cut portion 24, and has been pressed down. The angle θ of inclination may be 5±1 degrees as described above.

By manufacturing a resin-molded semiconductor device using the leadframe of this embodiment, almost no resin bur will be left on the land electrodes 16 of the land leads 4 during the resin molding process. As a result, the land electrodes will stick out of the resin encapsulant to reach a sufficient standoff height in the resin-molded semiconductor device.

In the foregoing embodiments, the leadframe is supposed to have the leads arranged in two lines, i.e., the leads of the first and second groups. However, according to the present invention, those leads do not have to be arranged in two lines but in any other number of lines. Thus, the present invention is effectively applicable to a leadframe with leads arranged in three, four or more lines.

By forming a resin-molded semiconductor device using the inventive leadframe, a land grid array (LGA) package, having external terminals arranged in two lines on its bottom, can be obtained with almost no resin bur left on the bottom. Also, according to the present invention, the land electrodes can be formed out of the leadframe on the bottom of the resin-molded semiconductor device without using any additional circuit board for the electrodes. As a result, the manufacturing costs can be cut down, and yet the device can be bonded onto a motherboard more reliably compared to the known bonding technique using leads.

In accordance with the inventive method for manufacturing a resin-molded semiconductor device, the resin molding process is performed using the leadframe and with the seal sheet adhered to the bottom of the leadframe. That is to say, there is no need to form any protruding leads unlike the known process. Thus, the lead bending process can be omitted. In addition, after the resin molding process is finished, the land leads will have their land electrodes exposed along the inner line on the bottom of the package and the leads will also have their land electrodes exposed along the outer line on the bottom. In this manner, two lines of external terminals can be arranged parallelly or like a hound's-tooth check, thus providing an LGA package. Furthermore, the land electrodes, arranged along the outer line on the bottom of the resin-molded semiconductor device, are parts of the leads and the outer side faces of those leads are exposed out of the package. Thus, by applying an adhesive such as solder to these side faces, fillet portions will be formed and the package can be bonded onto a motherboard on two sides, i.e., on the bottom and side faces. As a result, the package can be bonded more strongly and connected more reliably onto the motherboard.

What is claimed is:

1. A leadframe comprising:
    a frame rail made of a metal plate;
    a die pad for mounting a semiconductor chip thereon, the die pad being disposed approximately in a center region of an opening of the frame rail;
    support leads, one end of each said support lead supporting the die pad, the other end of the support lead being connected to the frame rail;
    a first group of leads, one end of each said lead of the first group extending toward the die pad, the other end of the lead of the first group being connected to the frame rail, part of the bottom of the lead of the first group being used as a land electrode of a first group; and
    a second group of leads, one end of each said lead of the second group extending toward the die pad and being closer to the die pad than the end of each said lead of the first group is, the other end of the lead of the second group being connected to the frame rail, part of the bottom of the lead of the second group being used as a land electrode of a second group,
    wherein the first and second groups of land electrodes are arranged in two lines, and
    wherein each said lead of the second group is arranged such that the bottom of each said land electrode of the second group is lower than the bottom of each said land electrode of the first group, and
    wherein said part of the lead of the second group is inclined downward corresponding to said land electrode of the first group.

2. The leadframe of claim 1, wherein said part of the lead of the second group is inclined at an angle between 3 and 15 degrees with a principal surface of the leadframe and corresponding to said land electrode of the first group.

3. The leadframe of claim 1, wherein each said lead of the second group is pressed down by half-cut pressworking from above said land electrode of the second group such that the bottom of each said land electrode of the second group is lower than the bottom of each said land electrode of the first group.

4. The leadframe of claim 1, wherein the upper surface of each said lead of the second group is greater in area than the lower surface thereof.

5. The leadframe of claim 1, wherein the surface of the die pad has a protruding portion.

6. The leadframe of claim 1, wherein a groove is formed in the surface or the bottom surface of the die pad.

7. The leadframe of claim 1, wherein a groove is formed in the surface of each said lead of the first group.

8. The leadframe of claim 1, wherein the outer edge of each said lead of the first group is thinner than the other portion thereof.

* * * * *